United States Patent [19]

Nyqvist

[11] Patent Number: 4,937,537
[45] Date of Patent: Jun. 26, 1990

[54] CIRCUIT ARRANGEMENT FOR COMPENSATING FOR THE THERMAL DRIFT OF A PHASE DETECTOR

[75] Inventor: Jouni Nyqvist, Muurla, Finland
[73] Assignee: Nokia-Mobira OY, Salo, Finland
[21] Appl. No.: 333,987
[22] Filed: Apr. 5, 1989
[30] Foreign Application Priority Data
Apr. 6, 1988 [FI] Finland ................................. 881593
[51] Int. Cl.$^5$ .............................................. H03L 7/00
[52] U.S. Cl. .......................................... 331/17; 331/25
[58] Field of Search ....................... 331/1 R, 8, 16, 17, 331/18, 25, 34; 328/155; 307/511

[56] References Cited
U.S. PATENT DOCUMENTS
4,118,674 10/1978 Ball .
4,155,050 5/1979 Nichols .................................. 331/17
4,302,732 11/1981 Moulton et al. .
4,389,621 1/1983 Futatsuishi .

Primary Examiner—Robert J. Pascal
Attorney, Agent, or Firm—Darby & Darby

[57] ABSTRACT

Circuitry for compensating for the temperature drift of a phase detector (1) in a phase-locked loop which comprises a phase detector (1), a loop filter (2) and in the feedback branch a voltage controlled oscillator (3) coupled to the phase detector (1). The phase detector (1) is provided with a differential output (I and II), which is coupled to the input terminals (− and +) of the operational amplifier (4) in the loop filter (2), whereby the common-mode temperature drift of the phase detector (1), appearing in the input poles of the operational amplifier, is substantially eliminated in the output of the amplifier (Uout).

15 Claims, 1 Drawing Sheet

CIRCUIT ARRANGEMENT FOR COMPENSATING FOR THE THERMAL DRIFT OF A PHASE DETECTOR

BACKGROUND OF THE INVENTION

The invention relates to DC-level temperature drift of an analog phase detector of a PLL (phase-locked loop). A conventional phase locked loop has a phase detector, a loop filter, and a feedback branch, which includes a voltage-controlled oscillator (VCO) coupled to the phase detector. While the phase difference between the incoming signals remains constant, the output level will drift as the temperature changes. In a PLL, detrimental temperature drift appears also in the loop filter and in the voltage-controlled oscillator VCO.

A PLL can be used for FM signal detection in FM-IF intermediate-frequency circuits.

In a phase-locked loop the thermal drifts of the different functions jointly offset the average frequency of the VCO to the degree that the loop cannot be caused to lock or that maintaining it locked becomes a problem.

This happens especially when the loop filter has been calibrated as a narrow-band filter and when the level of the incoming IF signal decreases from its nominal value. This situation appears, for example, when the receiver is listening to nothing but noise and the amplitude of the output signal of the limiter-amplifier remains deficient.

In theory it is possible to make each block of the PLL fully stable with respect to the temperature, but in reality there always appears temperature drift to some degree.

At its simplest the loop filter of a PLL comprises only resistors and capacitors. In that case there may in principle appear thermal drift in the loop only in the phase detector or the VCO.

The following compensation methods can be used with respect to temperature drifts:

A: If the temperature drifts of the different blocks are inverse to each other, the problem is eliminated. This results however, on the condition that the temperature coefficients change linearly or that the non-linearities are mirror images of one other. It is to be expected that at a great temperature change (range of change approximately 100° C.) the coefficients do not completely annul one another. In this case the loop's remaining locked or becoming locked will constitute a problem at the extreme temperatures. This is also seen as a distortion of the detection result.

B. The necessary offset voltage can be summated into the loop filter to compensate for the drift errors caused by the temperature. The precision requirement of the offset voltage becomes a problem if the drift errors are in the same direction.

The most common method of compensation in PLL circuits has so far been the solutions according to point A. On the other hand, very few PLL-IF circuits are available commercially, and so there are not very many alternative examples. According to experience, at the extreme values of the operating temperature the remainder of the circuit locked and its locking constitute a problem at low signal levels.

It would therefore be desireable to find a circuit arrangement by means of which the temperature drift of a phase detector is compensated for in a simple and economical manner.

SUMMARY OF THE INVENTION

In the circuitry according to the invention, the temperature drift of the phase detector is not visible in the output of the loop filter, and so the thermal drift of the VCO in principle remains the only error factor.

The operational amplifier itself causes a new offset temperature drift, but this drift is an order of magnitude smaller than the drift of the phase director.

The circuitry according to the invention provides as an additional feature the possibility of convenient control of the VCO.

The invention is described below with the aid of an embodiment example and a drawing relating to it, in which FIG. 1 is a block diagram of the wiring of the phase-locked loop, and FIG. 2 depicts a phase-locked loop having the circuitry according to the invention.

DESCRIPTION OF THE PREFERRED EMBODIMENT

Figure 1:
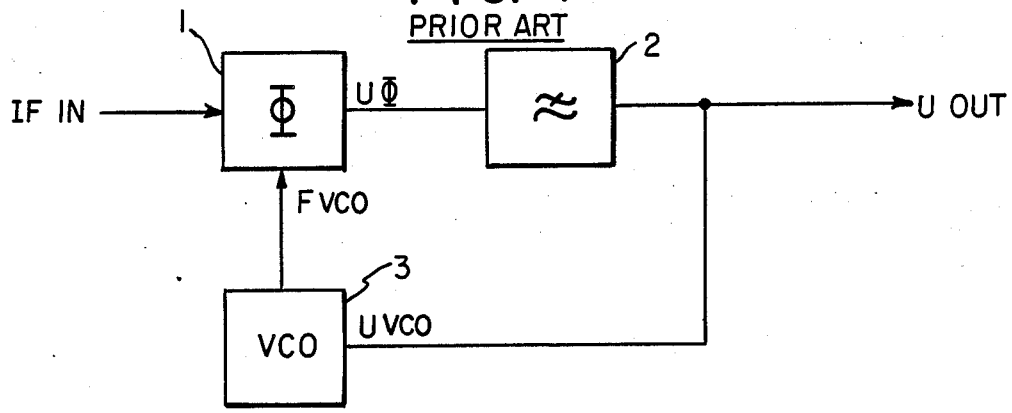

The phase-locked loop in FIG. 1 is an FM demodulator which comprises a phase detector 1, a loop filter 2, and a voltage-controlled oscillator VCO 3. An intermediate-frequency signal IFin is applied to the input of the phase detector 1. The output signal of the FM demodulator is Uout. In the stable state the phase difference between the signal IFin and the output signal Fvco of the VCO is 90°.

Figure 2:
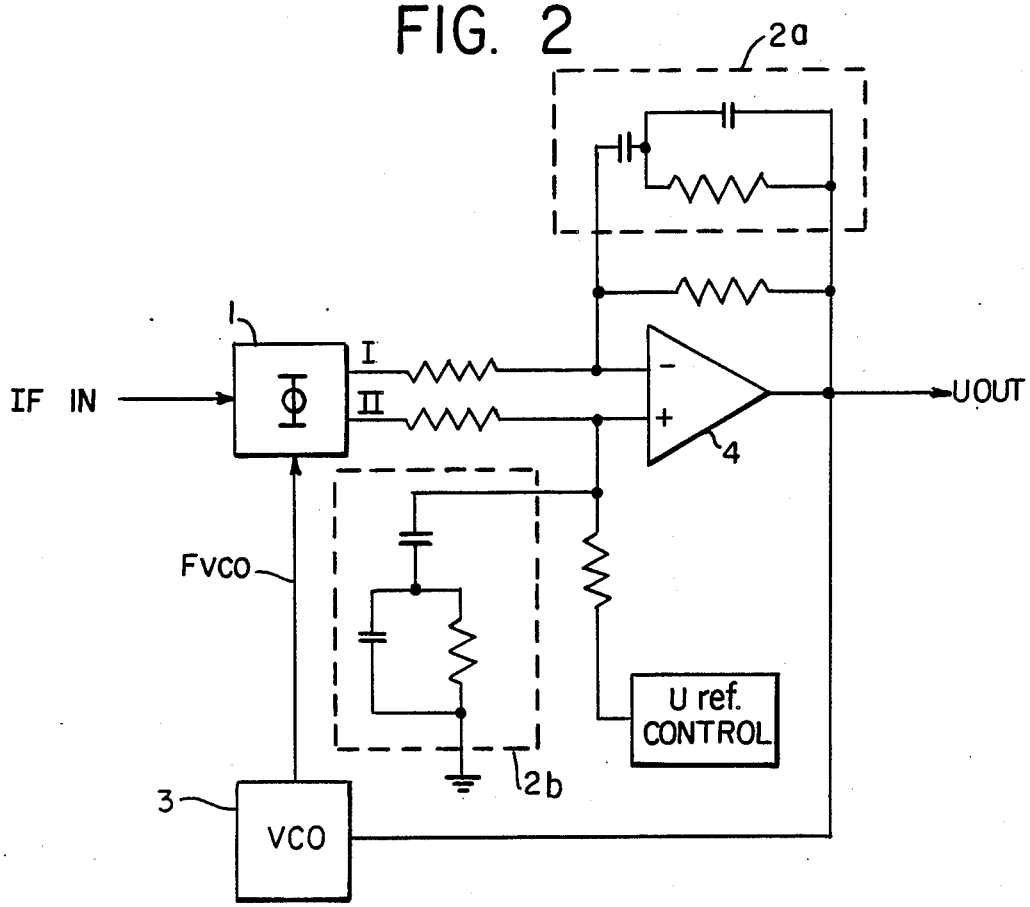

FIG. 2 shows the circuit arrangement according to the invention in which the output of the phase detector 1 of the PLL is differential, and an operational amplifier 4 is used in the loop filter 2.

In the present invention, the basic property of the differential amplifier to reject a common-mode signal is exploited.

When the output I of the phase detector 1 changes along with the temperature in, for example, a more positive direction, the output II also changes in the same direction by the corresponding amount. Since the changes are common-mode signals from the viewpoint of the differential amplifier, the operational amplifier 4 will not amplify the change. The best result is achieved in the rejection ratio of the common-mode signal if the resistances R of the circuitry are equal in value.

On the other hand, when the phase difference between the input signals IFin and Fvco of the phase detector 1 changes, the voltage levels of the outputs I and II change in the inverse direction, and the operational amplifier 4 amplifies this change in the voltage difference between the voltage levels arising from the change in the phase difference.

The loop filter 2 can be divided into the feedback branches of the operational amplifier symmetrically, which is represented in the figure by blocks 2a and 2b.

In the circuitry according to the invention, the temperature drift of the phase detector 1 does not show in the output of the loop filter 2, and so the thermal drift of the VCO 3 in principle remains the only error factor.

The operational amplifier 4 itself causes a new offset temperature drift, but this drift is an order of magnitude smaller than the drift of the phase detector 1.

The circuitry according to the method provides as an additional feature the possibility to control the VCO 3 conveniently via the non-inverting input of the operational amplifier 4 by using the voltage Uref. If the phase difference between the inputs of the phase detector 1 is 90° (when the loop is locked, the phase difference between the signals IFin and Fvco is 90°), the voltage difference between the outputs I and II is zero. In this case the output voltage of the loop filter 2 is precisely the same as the voltage Uref, and the output Uout follows directly the change in the voltage Uref. The potential of the voltage Uref does not affect the compensation for the thermal drift of the phase detector 1.

By control of the voltage Uref, the VCO 3 can be tuned to its average frequency and, on the other hand, this control voltage can also be used for compensating for the thermal drift of the oscillator.

The controls can be implemented as program control with the aid of a D/A transformer (not shown), in which case the tuning of the loop to its average frequency and the compensation for the drift can be automatic.

The differential amplifier can be made of transistor pairs, or a ready-made operational amplifier can be used in it. The decision to choose a differential amplifier or transistor pairs depends completely on the application chosen, but a simple construction is achieved with an operational amplifier integrated in advance.

If the circuitry is integrated on the same chip in the PLL, the operational amplifier is designed so as to be sufficiently good with respect to common-mode rejection, by using the necessary number of transistors and matched transistor pairs.

I claim:

1. A phase locked loop circuit for compensating for thermal drift; comprising:
    an analog phase detector being responsive to input signals for producing differential output signals each having a respective voltage level, said phase detector being responsive to changes in a phase difference between said input signals for changing a voltage difference between said voltage levels with respect to each other, said phase detector being responsive to changes in temperature for changing each of said voltage levels by the same amount and in the same direction so as to thereby enable thermal drift of said output signals to take place;
    amplifying means responsive to changes in said voltage difference between said voltage levels for amplifying said voltage difference and being free of amplifying changes in each of said voltage levels that are of the same amount and in the same direction, said amplifying means producing an amplified output voltage which at most thermally drifts less than said thermal drift of said output signals, said amplifying means having first and second input terminals and an output terminal;
    loop filter means coupled to each of said input terminals; and
    feedback means coupled between said amplifying means and said phase detector for transmitting one of said input signals to said phase detector so as to complete the phase locked loop and for which said voltage difference between said output signals becomes zero as said phase difference between said input signals becomes 90°.

2. A circuit as in claim 1, wherein said loop filter means includes two loop filters symmetric to each other.

3. A circuit as in claim 1, wherein said feedback means includes a voltage-controlled oscillator coupled to said phase detector for transmitting said one of said input signals.

4. A circuit as in claim 3, further comprising:
    means for providing a reference voltage to said second input terminal of said amplifying means, said loop filter having an output voltage which is the same as said reference voltage when said phase shift is 90°, said amplified output voltage of said amplifying means varying directly in response to changes in said reference voltage.

5. A circuit as in claim 3, further comprising:
    means for varying said reference voltage so as to compensate for thermal drift of said oscillator.

6. A circuit as in claim 3, further comprising:
    means for varying said reference voltage so as to tune frequency of said oscillator to a desired frequency.

7. A circuit as in claim 3, wherein said loop filter means includes a first loop filter coupled to said first input terminal of said amplifying means and a second loop filter connected between the second input terminal and said output terminal of said amplifying means.

8. A circuit as in claim 1, wherein said amplifying means includes an operational amplifier producing said output so that said output thermally drifts by an order of magnitude less than said thermal drift of said output signals.

9. A circuit as in claim 4, wherein said phase detector has first and second output terminals, further comprising:
    a first resistor coupled between said first output terminal of said phase detector and the first input terminal of said amplifying means;
    a second resistor coupled between said second output terminal of said phase detector and said second input terminal of said amplifying means;
    a third resistor between said first input terminal and said output terminal of said amplifying means; and
    a fourth resistor between said reference voltage providing means and said second input terminal of said amplifying means.

10. A circuit as in claim 9, wherein all of said resistors have the same resistance.

11. A phase locked loop circuit for compensating for thermal drift, comprising:
    an analog phase detector producing differential output signals and having a first input terminal, said phase detector being responsive to changes in a phase difference between input signals so as to change a voltage difference between said differential output signals, said phase detector also being responsive to changes in temperature for changing voltage levels of said output signals by the same amount in the same direction;
    an operational amplifier having an output terminal and having second input terminals, said operational amplifier producing an amplified output voltage to said output terminal;
    first and second resistors coupled between said second input terminals and said phase detector;
    a feedback branch having a voltage-controlled oscillator which has an output connected to one of said first input terminals of said phase detector, said feedback branch being connected between said output terminal of said operational amplifier and said one of said first input terminals of said phase detector;
    loop filter means coupled to said second input terminals of said operational amplifier, said operational amplifier being coupled to said phase detector via said first and second resistors;

a third resistor connected between said output terminal and one of said second input terminals of said operational amplifier; and a fourth resistor connected between a reference voltage and the other of said second input terminals.

12. A circuit as in claim 11, further comprising:

means for varying said reference voltage to compensate for thermal drift of said oscillator.

13. A circuit as in claim 11, further comprising:

means for varying said reference voltage so as to tune frequency of said oscillator.

14. A circuit as in claim 11, wherein said loop filter means includes first and second loop filters which are symmetric to each other and coupled to said input terminals of said operational amplifier respectively.

15. A circuit as in claim 14, wherein one of said loop filters is in a feedback branch between one of said input terminals and said output terminal of said operational amplifier, the other of said loop filters being between the other of said input terminal and ground.

* * * * *